(12) United States Patent
Williamson et al.

(10) Patent No.: US 8,377,629 B2
(45) Date of Patent: Feb. 19, 2013

(54) METHOD FOR PREPARING LITHOGRAPHIC PRINTING PLATE PRECURSORS

(75) Inventors: Alexander Williamson, Mortsel (BE); Peter Hendrikx, Hamont-Achel (BE); Marc Van Damme, Bonheiden (BE)

(73) Assignee: Agfa Graphics NV, Mortsel (BE)

( * ) Notice: Subject to any disclaimer, the term of this patent is extended or adjusted under 35 U.S.C. 154(b) by 176 days.

(21) Appl. No.: 12/996,077

(22) PCT Filed: Jul. 6, 2009

(86) PCT No.: PCT/EP2009/058498
§ 371 (c)(1),
(2), (4) Date: Dec. 3, 2010

(87) PCT Pub. No.: WO2010/006948
PCT Pub. Date: Jan. 21, 2010

(65) Prior Publication Data
US 2011/0143284 A1    Jun. 16, 2011

Related U.S. Application Data

(60) Provisional application No. 61/081,399, filed on Jul. 17, 2008.

(30) Foreign Application Priority Data

Jul. 16, 2008   (EP) .................................. 08104767

(51) Int. Cl.
*G03F 7/00* (2006.01)
*B41M 5/00* (2006.01)
(52) U.S. Cl. ...................... 430/302; 101/463.1; 101/453
(58) Field of Classification Search .................. None
See application file for complete search history.

(56) References Cited

U.S. PATENT DOCUMENTS

| | | | |
|---|---|---|---|
| 6,027,857 | A | 2/2000 | Li et al. |
| 6,071,675 | A | 6/2000 | Teng |
| 6,171,735 | B1 | 1/2001 | Li et al. |
| 6,245,481 | B1 | 6/2001 | Teng |
| 6,387,595 | B1 | 5/2002 | Teng |
| 6,420,089 | B1 | 7/2002 | Baumann et al. |
| 6,482,571 | B1 | 11/2002 | Teng |
| 6,576,401 | B2 | 6/2003 | Teng |
| 2003/0165778 | A1 | 9/2003 | Makino et al. |
| 2004/0013968 | A1 | 1/2004 | Teng |
| 2004/0259027 | A1 | 12/2004 | Munnelly et al. |

FOREIGN PATENT DOCUMENTS

| | | |
|---|---|---|
| EP | 2 105 799 A1 | 9/2009 |
| WO | WO 2005/111727 A1 | 11/2005 |
| WO | WO 2005111727 A1 * | 11/2005 |
| WO | WO 2007/057334 A1 | 5/2007 |
| WO | WO 2007/057335 A1 | 5/2007 |
| WO | WO 2007/057336 A1 | 5/2007 |
| WO | WO 2007/057348 A1 | 5/2007 |
| WO | WO 2007/057349 A1 | 5/2007 |

* cited by examiner

*Primary Examiner* — Cynthia Kelly
*Assistant Examiner* — Chanceity Robinson
(74) *Attorney, Agent, or Firm* — Leydig, Voit & Mayer, Ltd.

(57) ABSTRACT

A method of preparing a lithographic printing plate in which no pre-heat step is used comprising the steps of:—providing a lithographic printing plate precursor comprising a support and a photopolymerizable image-recording layer, the image-recording layer comprising a monomer and a binder;—image-wise exposing the precursor in an exposure unit;—off press developing the exposed precursor with an aqueous solution in a processing unit; characterized in that the ratio of the total amount of monomer to the total amount of binder is at least 1 and the time lapse between exposing an image-area of the precursor and contacting the image-area with the aqueous solution is at least 1 minute.

21 Claims, No Drawings

METHOD FOR PREPARING LITHOGRAPHIC PRINTING PLATE PRECURSORS

FIELD OF THE INVENTION

The present invention relates to a method and apparatus for preparing photopolymer printing plates.

BACKGROUND OF THE INVENTION

In lithographic printing, a so-called printing master such as a printing plate is mounted on a cylinder of the printing press. The master carries a lithographic image on its surface and a printed copy is obtained by applying ink to said image and then transferring the ink from the master onto a receiver material, typically paper. In conventional, so-called "wet" lithographic printing, ink as well as an aqueous fountain solution (also called dampening liquid) are supplied to the lithographic image consisting of oleophilic (or hydrophobic, i.e. ink-accepting, water-repelling) areas as well as hydrophilic (or oleophobic, i.e. water-accepting, ink-repelling) areas. In so-called "driographic" printing, the lithographic image consists of ink-accepting and ink-abhesive (ink-repelling) areas and during driographic printing only ink is supplied to the master.

The so-called "analogue" printing plates are generally obtained by first applying a so-called computer-to-film (CtF) method, wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master. Since about 1995, the so-called "computer-to-plate" (CtP) method has gained a lot of interest. This method, also called "direct-to-plate", bypasses the creation of film because the digital document is transferred directly to a printing plate precursor by means of a plate-setter. A printing plate precursor for CtP is often called a digital plate.

Digital plates can roughly be divided in three categories: (i) silver plates, working according to the silver salt diffusion transfer mechanism; (ii) photopolymer plates containing a photopolymerizable composition that hardens upon exposure to light and (iii) thermal plates of which the imaging mechanism is triggered by heat or by light-to-heat conversion.

Photopolymer plate precursors can be sensitized for blue, green or red light (i.e. wavelength range between 450 and 750 nm), for violet light (i.e. wavelength range between 300 and 450 nm) or for infrared light (i.e. wavelength range between 750 and 1500 nm). Lasers have become the predominant light source used to expose photopolymer printing plate precursors. Typically, an Ar laser (488 nm) or a FD-YAG laser (532 nm) can be used for exposing a visible light sensitized photopolymer plate precursor. The wide-scale availability of low cost blue or violet laser diodes, originally developed for data storage by means of DVD, has enabled the production of plate-setters operating at shorter wavelength. More specifically, semiconductor lasers emitting from 350 to 450 nm have been realized using an InGaN material. For this reason, photopolymer plates having their maximal sensitivity in the 350 nm to 450 nm region have been developed during the last years. An advantage of violet photopolymer technology is the reliability of the diode laser source and the possibility of handling the non-developed photopolymer plate precursors in yellow safelight conditions. The use of infrared lasers also became more important in the last years, for example the Nd-YAG laser emitting around 1060 nm but especially the infrared laser diode emitting around 830 nm. For these laser sources, infrared sensitive photopolymer plate precursors have been developed. The major advantage of infrared photopolymer technology is the increased possibility to handle the non-developed photopolymer plate precursors in daylight conditions.

After image-wise exposure of a photopolymer plate precursor a rather complex processing is typically carried out. A pre-heat step is usually carried out to enhance the polymerization and/or crosslinking in the imaged areas. Then, during a pre-wash step, typically with plain water, the protective layer of the photopolymer plate precursor is removed. After the pre-wash step the non-imaged parts are removed in a development step, typically with an alkaline developer having a pH >10. After the development step, a rinse step, typically with plain water, and a gumming step is carried out. Gumming protects the printing plate during the time between development and printing against contamination, fingerprints, fats, oil or dust, or against damage, for example during handling of the plate. Such processing of photopolymer plates is usually carried out in automatic processors having a pre-heat section, a pre-wash section, a development section, a rinse and gum section and a drying section.

To avoid this complex, time consuming and environmentally unfriendly processing of photopolymer plate precursors several alternatives have been described.

In U.S. Pat. Nos. 6,027,857, 6,171,735, 6,420,089, 6,071,675, 6,245,481, 6,387,595, 6,482,571, 6,576,401 and 6,548,222 a method is disclosed for preparing a lithographic printing plate wherein a photopolymer plate precursor, after image-wise exposure, is mounted on a press and processed on-press by applying ink and fountain to remove the unexposed areas from the support. Also US2003/16577 and US2004/13968 disclose a method wherein a plate precursor comprising a photopolymerizable layer can be processed on-press with fountain and ink or with a non-alkaline aqueous developer.

In WO2005/111727 a method is disclosed wherein a photopolymer plate precursor is developed by applying a gum solution to the precursor.

The gum solution, for example a gum solution used in the gumming step of a conventional processing method, is used for both developing, i.e. removing the non-imaged parts of the coating, and gumming the exposed photopolymer plate precursors. According to this method, no pre-wash step, no rinse step and no additional gum step is needed anymore during processing. This method thus provides a simplified processing of photopolymer plate precursors and in addition, since on the one hand no highly alkaline developer is used anymore and on the other hand much less processing liquids are used altogether (no pre-wash, no rinse and no separate gumming), provides an environmentally more friendly processing. WO2007/057334 also discloses a method to prepare photopolymer plates wherein the development is carried out with a gum solution. However, in this method a pre-wash is carried out before development with the gum solution. Other methods, all using a gum solution to develop photopolymer plate precursors, are disclosed in for example WO2007/057335 and WO2007/057349. WO2007/057348 and WO2007/057336 disclose a method wherein a gum solution is used to develop a photopolymer plate precursor and wherein a pre-heat step is carried out after exposure and before development. In WO2007/057336, the pre-heat section and the development section are combined in one single apparatus.

Development with the gum solution in the above mentioned methods is usually carried out at room temperature.

Typically, in the above described methods, a pre-heat step is carried out between exposure and development. Providing a pre-heat step after exposure and before processing of a photopolymer printing plate precursor is well known in the art. The pre-heat treatment accelerates the polymerization and/or cross-linking in the imaged parts of the precursor, thereby increasing the durability and improving the hardness of the imaged parts. This may result in an increased run length, i.e. number of high quality prints that can be obtained with a single printing plate.

During such a pre-heat step, the plate is typically kept at a plate surface temperature, measured on the back side of the plate, ranging from 70° C. to 150° C. for a period of one second to 5 minutes using heating means such as a conventional convection oven, IR lamps, UV lamps, an IR laser, IR tiles, a microwave apparatus or heated rollers, for example metal rollers.

To further simplify the method of preparing photopolymer printing plates it would be advantageous if the pre-heat step could be omitted, while still obtaining printing plates with sufficient lithographic properties.

The pre-heat unit, whether or not incorporated in a single processing unit, could then be eliminated. In cases where the pre-heat unit is combined with a development unit in a processing unit, a further simplification of the processing unit would then become possible resulting in a further reduction of the floor space, also referred to as foot print, of the processing unit.

The absence of a pre-heat unit would reduce the cost associated with the processing of photopolymer plate precursors. No pre-heat section has to be put in place, whether combined or not with a development unit in a processing unit, and moreover, less energy will be consumed while processing.

In addition, a pre-heat may result in an inconsistent quality of the obtained printing plates due to inhomogeneous heating of the precursor, or due to fluctuations of the pre-heat temperature as function of the life time of the heating means used.

Another disadvantage of a pre-heat unit when included in a processing unit without a pre-wash unit may be that the temperature of the developing solution increases, resulting in inconsistent and even inferior lithographic properties of the obtained printing plates. Such increase may be minimized by incorporating cooling means in the processing unit as disclosed in the unpublished EP-A 08 102 922.5 (filed 2008-03-26). However, when a pre-heat unit is no longer necessary, the temperature increase of the developing solution will be much less, even in the absence of a cooling means, which will result in more consistent lithographic properties of the obtained printing plates.

SUMMARY OF THE INVENTION

It is first object of the present invention to provide a more simplified, cost and energy friendly method for making photopolymer printing plates. With the provided method, lithographic printing plates are obtained with sufficient and consistent lithographic properties.

It is a second object of the present invention to provide an apparatus especially adapted to carry out such a method for making photopolymer printing plates.

The first object is realized by the method as defined in claim 1. Preferred embodiments of the method are defined in dependent claims.

The second object is realized by the apparatus as defined in claims 13 and 16. Preferred embodiments of the apparatus are defined in dependent claims.

DETAILED DESCRIPTION OF THE INVENTION

It has been found that in the preparation of photopolymer printing plates, a pre-heat step can be eliminated while still obtaining sufficient lithographic properties, more particularly a sufficient physical strength of the image-areas, when a particular ratio of monomer to binder is used and when a particular time lapse between exposure and development of the photopolymer printing plate precursor is observed.

The method according to the present invention to prepare a lithographic printing plate in which no pre-heat step is used comprises the steps of:
- providing a lithographic printing plate precursor comprising a support and a photopolymerizable image-recording layer, the image-recording layer comprising a monomer and a binder;
- image-wise exposing the precursor in an exposure unit;
- off press developing the exposed precursor with an aqueous solution in a processing unit;

characterized in that the ratio of the total amount of monomer to the total amount of binder is at least 1 and the time lapse between exposing an image-area of the precursor and contacting the image-area with the aqueous solution is at least 1 minute.

Preferably, the time lapse between exposing an image-area of the precursor and contacting the image-area with the aqueous solution is at least 2.5 minutes, more preferably at least 5 minutes, most preferably at least 10 minutes. However, the time lapse may also be 15 or 30 minutes or more. A large time lapse between exposure and development may however adversely affect the throughput, i.e. number of plates that can be produced in a given time interval. Therefore, the time lapse is preferably smaller than 2 hours, more preferably smaller than 1 hour, most preferably smaller than 30 minutes.

Surprisingly, it seems that during the time lapse between exposure and development of the precursor and without raising the temperature in a pre-heat unit to typically 70° C.-150° C., the polymerization reaction in the image-areas, initiated upon exposure, proceeds at room temperature. Although room temperature is typically below the Tg of typical binders used in photopolymer plates, the polymerization reaction proceeds to a degree where the obtained printing plates have sufficient lithographic properties. The fact that the ratio of the total monomer amount to the total binder amount influences the time lapse that has to be respected in order to achieve sufficient lithographic properties, may indicate that the local concentration of monomer may influence the polymerization reaction during the time lapse between exposure and development and the resulting physical strength of the polymerized image areas. In addition, the monomer amount may influence the Tg of the photopolymerized layer and therefore the polymerization reaction at room temperature in the time interval between exposure and development.

It has been observed that when the ratio of the total monomer amount to the total binder increases, the time lapse between exposure and development that has to be respected in order to obtain sufficient lithographic properties may decrease. Therefore, in a preferred embodiment, the total monomer amount is higher than the total binder amount. The ratio of the total amount of monomer to the total amount of binder is at least 1, preferably at least 1.25, more preferably at least 1.50. When the ratio of the total amount of monomer to the total amount of binder is less than 1, it may be that sufficient lithographic properties are obtained when a longer time lapse between exposure and development is observed during plate making. For example, when the ratio of the total amount of monomer to the total amount of binder is at least 0.65, sufficient lithographic properties are realized when the time lapse between exposing an image-area of the precursor and contacting the image-area with the aqueous solution is at least 10 minutes.

Photopolymer Printing Plate Precursor

Any photopolymer printing plate precursor capable of being developed with an aqueous solution may be used in the present invention. Most preferably, an aqueous solution with a pH from 2 to 10 is used. The photopolymer printing plate precursors are preferably sensitized for violet light, i.e. for light having a wavelength ranging from 300 nm to 450 nm, or for infrared light, i.e. light having a wavelength ranging from 750 nm to 1500 nm.

A typical photopolymer printing plate precursor comprises a photopolymerizable coating provided on a hydrophilic support.

The support is preferably a grained and anodized aluminum support, well known in the art. Suitable supports are for example disclosed in EP-A 1 843 203 (paragraphs [0066] to [0075]). The grained and anodized aluminum support may be subjected to so-called post-anodic treatments, for example a treatment with polyvinylphosphonic acid or derivatives thereof, a treatment with polyacrylic acid, a treatment with potassium fluorozirconate or a phosphate, a treatment with an alkali metal silicate, or combinations thereof. However, in a preferred embodiment of the present invention the support is a grained and anodized aluminum support without any post-anodic treatment.

Besides an aluminum support, a plastic support, for example a polyester support, provided with one or more hydrophilic layers may also be used.

The coating provided on a hydrophilic support comprises a photopolymerizable layer, also referred to as the image-recording layer or photo-layer. The coating may further comprise an overcoat and/or an undercoat, the latter also referred to as an intermediate layer or an interlayer.

The overcoat, provided on the photopolymerizable image-recording layer, also referred to as a toplayer or a protective layer, acts as an oxygen barrier layer. Preferred binders which can be used in the top layer are disclosed in WO2005/029190 (page 36 line 3 to page 39 line 25), US 2007/0020563 (paragraph [0158]) and EP 1 288 720 (paragraphs [0148] and [0149]). The most preferred binders for the overcoat are polyvinylalcohol and polyvinylpyrrolidone. The total dry weight of the overcoat is preferably between 0.25 and 3.0 g/m$^2$, more preferably between 0.50 and 2.0 g/m$^2$, most preferably between 0.75 and 1.75 g/m$^2$.

The photopolymerizable layer or image-recording layer typically comprises at least one polymerizable monomer or oligomer, at least one polymeric binder, a photo-initiator and a sensitizer. The photo-initiator-sensitizer system is chosen as function of the exposure wavelength. The photopolymerizable layer may further comprise a contrast dye or pigment, a polymerization inhibitor, a chain transfer agent, adhesion promoting agents interacting with the aluminum surface and other ingredients which may further optimize the properties of the printing plate precursors.

A preferred adhesion promoting agent, also referred to as adhesion promoter, is a compound containing an ethylenically unsaturated bond and a group capable of interacting with the support as disclosed in the unpublished EP 07 120 845.8 (filed on 2007-11-16). A particularly preferred adhesion promoter is a compound comprising a (meth)acrylate group and wherein the group capable of interacting with the support is a group selected from a phosphate group, a phosphonate group, a carboxylic group and a alkyloxysilane group. It is preferred that such adhesion promotors are provided in the photopolymerizable layer.

In another preferred embodiment the photopolymerizable layer comprises a hydrophilic polymer as disclosed in the unpublished EP-A 07 120 845.8 (filed on 2007-11-16), i.e. a hydrophilic polymer having at least 1 mol % of a first monomeric unit having a phosphate group, a phosphonate group, a carboxylic acid group, a sulphonic acid group, a phenolic group, a trialkoxysilane group, an ammonium group or a phosphonium group and at least 30 mol % of a second monomeric unit having a hydrophilic group.

In a particular preferred embodiment the adhesion promoter and hydrophilic polymer mentioned above are provided in combination in the photopolymerizable layer.

In still another preferred embodiment the photopolymerizable layer comprises a binder with an acid value of less than 0.3 meq/g. Examples of such binders are disclosed in EP-A 1 882 585 paragraph [0036] to [0057]. Most preferably however, such binder is a partially hydrolyzed polyvinylacohol with a hydrolysis degree from 10 to 65 mol %.

Preferably the binder has a glass transition temperature of less than 80° C.

The total amount of binder is optimized in view of obtaining a photopolymerizable layer which is not too sticky, allowing ease of coating of the photopolymerizable layer on a production line, and obtaining a photopolymerizable layer of which the non-imaged areas can easily be removed by the processing liquid, while at the same time, obtaining image-areas which are sufficiently resistant against the processing liquid. The total binder concentration ranges from 50 to 1 000 mg/m$^2$, more preferably from 75 to 750 mg/m$^2$, most preferably from 100 to 500 mg/m$^2$.

Too much monomer in relation to binder may result in a too sticky photopolymerizable layer, or a too rapid increase of the Tg of the photopolymerizable layer during and/or after imaging, resulting in too early vitrification of the layer and hence incomplete polymerization. The total monomer concentration ranges from 50 to 1 500 mg/m$^2$, more preferably from 100 to 1 000 mg/m$^2$, most preferably from 250 to 750 mg/m$^2$.

When the photopolymerizable coating comprises a pigment, it is preferred that the pigment is dispersed with a dispersant which is free from a —COOH, —PO$_3$H$_2$ and a —OPO$_3$H$_2$ group. Examples of such pigment dispersions are disclosed EP-A 1 882 585 (paragraph [0058] to [0087]). Alternatively, a self-dispersing pigment, i.e. a pigment which does not require a dispersant, is preferred.

A pigment is typically added to the photopolymerizable coating to obtain a so-called visible printout image after processing. This enables a visual inspection of the image before mounting the printing plate on a printing press. When however a time lapse has to be respected before development of an exposed precursor, for example 5 minutes or more, it takes longer before such a visual inspection may be carried out. To avoid this, it may be advantageous to add compounds to the coating which upon exposure form a visible image. This enables the visual inspection to take place immediately after exposure.

The coating may also comprise one or more intermediate layers provided between the photopolymerizable image-recording layer and the support. Such an intermediate layer may further optimize the interaction between the image-recording layer and the support, i.e. enable the complete removal of non-imaged parts and a sufficient adhesion of the imaged parts of the image-recording layer to the support. In a preferred embodiment however, no intermediate layer is provided between the grained and anodized aluminum support and the photopolymerizable image-recording layer.

Preferred violet sensitive printing plate precursors are disclosed in WO2005/111727, WO2005/029187, WO2007/113083, WO2007/057333, WO2007/057442 and the unpublished EP-As 07 108 955, 07 108 957 and 07 108 953, all filed on 2007-05-25. Other violet sensitive printing plate precursors that may be used in the method of the present invention are those disclosed in EP-A 1 793 275, US2007/0184387 and EP-A 1 882 585. Preferred initiators used in the violet sensitive printing plates are hexaarylbisimidazole compounds. Preferably the hexaarylbisimidazole initiator is combined with a heteroaromatic thiol compound, most preferably benzthiazole, benzimidazole or benzoxazole compound as co-initiator. Preferred sensitizers used in the violet sensitive printing plates are those disclosed in the unpublished EP-As 07 108 955, 07 108 957 and 07 108 953, all filed on 2007-05-25.

Preferred IR sensitive printing plate precursors are disclosed in WO2005/111727, EP-As 1 788 448 and 1 788 449 and the unpublished EP-A 07 120 845.8 (filed on 2007-11-16). Other IR sensitive printing plate precursors that may be used in the method of the present invention are those disclosed in EP-As 1 602 982, 1 621 339, 1 630 618 and 1 695 822. Most preferred initiators to be used in the IR sensitive printing plate precursors are trihalomethylphenyl-sulphones and halomethyl triazines.

The total dry weight of the photopolymerizable layer is less than 4.0 $g/m^2$, more preferably less than 3.0 $g/m^2$, most preferably less than 2.0 $g/m^2$.

Exposure

The image-wise exposure of the lithographic printing plate precursor is typically carried out in a platesetter, i.e. an exposure unit suitable for image-wise exposing the precursor with a laser emitting actinic light. In a preferred embodiment, the precursor is image-wise exposed by a laser emitting infrared or violet light.

Laser exposure with infrared light, i.e. light having a wavelength from 750 nm to 1 500 nm, may be carried out with a diode laser, emitting around 830 nm, or with a Nd:YAG, Nd:YVO$_4$ or Nd:YLF laser, emitting above 1 000 nm.

Laser exposure with violet light, i.e. light having a wavelength from 300 nm to 450 nm, preferably from 350 nm to 450 nm, is typically carried out with a semiconductor laser diode based on gallium nitride. Highly preferably, commercially available InGaN-based semiconductor laser diodes having a wavelength of around 405 nm, are used to expose the lithographic printing plate precursors.

In another embodiment, a digitally modulated UV-exposure, e.g. by means of digital mirror devices, may also be used.

Three major categories of plate-setters, i.e. apparatuses wherein the lithographic printing plates are imagewise exposed with a laser beam, are known and may be used in the present invention: flat bed, internal drum (ITD) and external drum (XTD) type platesetters.

Time Lapse Between Exposure and Development

According to the present invention, the time lapse between exposing an image-area of the precursor and contacting that image-area with the developing solution is at least 1 minute, preferably at least 2.5 minutes, more preferably at least 5 minutes.

When there is no automatic transportation of the exposed precursors from the exposure unit to the processing unit, the exposed precursors may be stored for a sufficient time before entering them into the processor unit. Depending on the sensitivity of the precursors to ambient daylight, the temporary storage may be in (substantial) darkness or under safe light conditions. The exposed precursors may be stored in a dedicated storage apparatus. Such an apparatus may be temperature and/or humidity controlled.

However, it is preferred that the exposed precursor is automatically transported from the exposure unit towards the processing unit. To realize such an automatic transportation, the exposure unit and processing unit are preferably connected to each other. However, according to the present invention, care has to be taken that the time lapse between exposing an image-area of the precursor and contacting that image-area with the developing solution is at least 1 minute, preferably at least 2.5 minutes, more preferably at least 5 minutes. Therefore, it is preferred to use a mechanism which delays the transfer of the exposed precursor from the exposure unit to the processing unit.

In a typical configuration wherein the exposure unit is coupled to the processing unit, the exposed precursor is transported towards the processing unit by transferring means. The transferring means may be selected from a conveyer belt, grippers, suction cups, clamps, rollers, or a combination thereof.

The exposed precursor is typically transported from the exposure unit towards the processing unit by a transferring means at a certain speed over a given distance to ensure the highest possible throughput, i.e. number of plates produced in a given time interval. To arrive at a sufficient time lapse between exposure and development, the distance between the exposure unit and the processing unit over which the exposed precursor is to be transported can be adjusted, i.e. the longer the distance the exposed precursor needs to be transported, the longer the time lapse between exposure and development.

The speed at which the exposed precursor is transported from the exposure unit towards the processing unit may also be adjusted to result in the required time lapse between exposure and development, i.e. a slower transporting speed, or a transport that periodically stops or slows down, means a longer time lapse between exposure and development. However, when the exposed precursors are transported from the exposure unit towards the processing unit one by one, the transportation speed must take into account the speed at which the precursors are exposed. For example when the transferring means comprises a conveyer belt, to avoid overlap of subsequent exposed precursors, i.e. to avoid an exposed precursor being placed (partially) upon an earlier exposed precursor on the conveyer belt, and hence to avoid entrance of more than one exposed precursor at a time into the processor, it may be necessary to adjust the speed at which the precursors are exposed to the transportation speed.

Decreasing the speed at which the precursors are exposed is however often seen as a major disadvantage, for example in the newspaper business wherein a high throughput, i.e. high number of plates that can be produced in a given time interval, is very important. For these applications, it may for example be advantageous to allow the overlap of subsequent exposed precursors on the conveyer belt mentioned above. When allowing such an overlap of exposed precursors, a mechanism has to be put in place to avoid entrance of more than one exposed precursor in the processing unit at the same time. Another possibility is to hold one or more exposed precursors, for example with suction cups or clamps for a sufficient time before placing them on or placing them back on the conveyer belt. Other delaying mechanisms may be used to ensure that, while keeping the speed of exposing the precursors as high as possible, the time lapse between exposure and development is at least 1 minute.

For these high throughput applications, it may be more preferred that the transferring means comprises a stacking unit. Such a stacking unit may act as buffer, by temporary storage of the exposed precursors before they enter the processing unit, so that the time lapse between exposure and development may be adjusted without the need to decrease exposure times. When such a stacking unit is present, the first exposed precursor is stored in the stacking unit, sufficiently long so that the time lapse between exposing an image-area of the precursor and contacting that image-area with the developing solution is at least 1 minute, preferably at least 2.5 minutes, more preferably at least 5 minutes. During that time, a second precursor is exposed and subsequently stored in the stacking unit. The same applies for the third and each subsequent exposed precursor. When for the first exposed precursor stored in the stacking unit, the time lapse between exposure and development is sufficiently long, that precursor will be entered in the processing unit. This precursor can then be replaced in the stacking unit by the following exposed precursor. The same applies for the second and each subsequent stored precursor.

Such a stacking unit may have different configurations. The exposed precursors may be stacked vertically or horizontally and the stacks may be stationary, or moving for example in a rotating carousel set-up. It may be necessary to provide lifting mechanisms to move the exposed plates from for example the exit belt of the exposure unit to the stacking unit and subsequently to move the temporary stored precursors form the stacking unit again to for example a conveyer belt further transporting the precursors to the processing unit. The temporary storage of the exposed precursors in the stacking unit, depending on their sensitivity to ambient daylight, may be under safe light conditions or the exposed precursors may be totally shielded from light. The stacking unit may be temperature and/or humidity controlled. The temperature in such a stacking unit may be between 20° and 60° C., preferably between 25° and 40° C., most preferably room temperature. The exposed precursors may be stored in contact with each other in the stacking unit or the stacking unit may comprise means to keep the stored precursors separated from each other.

The capacity of the stacking unit must be high enough to enable an exposure which is as fast as possible while it is still possible to adjust the time lapse between exposure and development to at least 1 minute. Such a capacity may be for example up to 300 plates per hour.

The exposed precursors may also be provided with some kind of identification, e.g. a bar code, containing information of the time the precursor has been exposed. Such identification can then be used in the buffering system to decide which precursor may be transported to the processing unit.

The advantage of transferring means comprising a stacking unit is the fact that it is not necessary to lower the speed at which the precursors are exposed and processed in order to respect the time lapse between exposure and development. For this reason, the productivity of the plate making method remains more or less constant despite the fact that a time lapse has to be respected between exposure and development.

Apparatus

To carry out the method to prepare photopolymer printing plates according to the present invention, a dedicated apparatus is preferably used.

Therefore, the second object of the invention is an apparatus for preparing lithographic printing plates wherein an exposed precursor is automatically transported from the exposure unit to the processing unit characterized in that the apparatus comprises a mechanism which delays the transfer of the exposed precursor from the exposure unit to the processing unit. The presence of the delaying mechanism enables an adjustment of the time lapse between exposing and developing the precursor. Preferably, the delaying mechanism enables a time lapse between exposing an image-area on the precursor and contacting the exposed image-area with a developing solution of at least 1 minute, preferably at least 2.5 minutes, more preferably at least 5 minutes.

The apparatus comprise an exposure unit, a processing unit and transferring means which transport the exposed precursor from the exposure unit to the processing unit characterized in that the time lapse between exposing an image-area on the precursor in the exposure unit and contacting the exposed image-area with a developing solution in the processing unit is at least 1 minute, preferably at least 2.5 minutes, more preferably at least 5 minutes. The transferring means may be selected from conveyer belts, grippers, suction cups, clamps, rollers or a combination thereof. The delaying mechanism may consist of a conveyer which moves at a sufficiently slow speed, a conveyer where the distance traveled by the exposed precursor is sufficiently long, a conveyer which periodically slows down or stops, clamps or suction cups which hold exposed precursors for a sufficient length of time, or a stacking unit.

According to a preferred embodiment, the transferring means comprises a stacking unit, as described above. The stacking unit temporarily stores exposed printing plate precursors in the form of a horizontal or vertical stack. The temporary storage in the stacking unit enables the adjustment of the time lapse between exposing an image-area on the precursor in the exposure unit and contacting the exposed image-area with a developing solution in the processing unit to preferably at least 1 minute, more preferably at least 2.5 minutes, most preferably at least 5 minutes.

Depending on the sensitivity of the exposed precursors to ambient daylight, the apparatus may be constructed in such a way that the exposed precursors are totally shielded from light or are under safe light conditions before development of the precursors.

Development

Development is carried out off press with an aqueous solution, preferably having a pH from 2 to 10, more preferably from 3 to 9, most preferably from 4 to 8. During development, an optional overcoat and the non-imaged areas of an image-recording layer are removed. Development is preferably carried out in an automatic processor using spray or dip development. Spray development involves spraying a developing solution on the plate precursor, for example with one or more spray bars. Dip development involves immersion of the plate into a developing solution. The development may be a batch development, i.e. development is carried out with a batch of developer until development is no longer sufficient. At that moment a new batch of developer is introduced in the processor. Development may also be carried out with regeneration of the developer, whereby a given amount of fresh developer is added to the development solution as function of the number of plates already developed. The composition and/or concentration of the fresh developer added during regeneration may be the same or different to that of the initial developer.

The developing step with the aqueous solution may be combined with mechanical rubbing, preferably by one, two or more rotating brushes, to better remove the non-imaged parts of an image-recording layer. Preferred rotating brushes are described in US2007/0184387 (paragraphs [0255] to [0257]) and EP-A 1 755 002 (paragraphs [0025] to [0034]). Good results may also be obtained with "flat" brushes. These "flat"

brushes may have a width of for example 5.0 to 10 cm and may be equipped with polypropylene or nylon bristles. The length of the bristles may be from 5 to 15 mm. Typically, these "flat" brushes are rubbing the plate precursor by moving back and forth in a direction perpendicular to the plate conveying direction through the processor. Rubbing may be realized by up to 120 movements per minute.

Preferably, the aqueous solution is a gum solution. A gum solution is essentially an aqueous solution comprising a surface protective compound capable of protecting the lithographic image of a printing plate against contamination. Suitable examples of such compounds are film-forming hydrophilic polymers or surfactants. When using a gum solution as developing solution, in the development step in the method according to the present invention the non-image areas of the precursor are removed and, in addition, a protective layer is provided on the developed printing plate. Referring to the conventional processing of photopolymer plates this means developing and gumming in a single step. A layer that remains on the plate after development with the gum solution preferably comprises more than 0.01 g/m$^2$ of a surface protective compound.

The gum solution may be supplied as a ready-to-use developer or as a concentrated solution, which is diluted by the end user with water to a ready-to-use developer according to the instructions of the supplier: typically 1 part of the gum is diluted with 1 to 10 parts of water.

A preferred composition of the gum solution is disclosed in WO2005/111727 (page 6, line 5 to page 11, line 35) and EP-A 1 621 339 (paragraphs [0014] to [0061]).

Preferred surfactants are for example block copolymers based on ethylene oxide and propylene oxide such as the commercially available Pluronic® surfactants such as Pluronic 9400. Other preferred surfactants are tristyrylphenol ethoxylates such as the Emulsogen® surfactants, for example Emulsogen TS160 or TS200. Highly preferred, a combination of both these surfactants is used.

Besides the surface protective compound the gum solution preferably comprises a salt formed by reaction of an acid, selected from phosphoric acid and phosphorous acid, with a di- or tri-alkanolamine as disclosed in the unpublished WO2008/055872 (filed on 2008-05-14).

Development is typically carried out at temperatures of the developing solution between 20° C. and 50° C., preferably between 20° C. and 40° C., most preferably between 20° C. and 30° C. In the method according to the present invention, the temperature of the developing solution changes preferably not more than 15° C., more preferably not more than 10° C., most preferably not more than 5° C.

In another embodiment of the present invention, the development of the printing plate precursor with the aqueous solution, preferably the gum solution, results in a partial removal of the coating in the non-image areas. A complete removal of the coating in the non-image areas is established on press by applying ink and/or fountain.

When the time between the preparation of the printing plate and mounting that printing plate on a press to start printing is sufficiently short so that no severe contamination may take place, development may be carried out with any aqueous solution having preferably a pH between 2 and 10, even plain water. Also commonly used press room chemicals, for example fountain solutions or aqueous plate cleaners and/or conditioners may be used, if necessary after proper dilution.

After development, the obtained printing plates may be baked. Such post-baking is well known in the art and may increase the run length of the printing plates. Such a baking unit may be integrated in the apparatus described above.

EXAMPLES

Materials

All materials used in the examples were readily available from standard sources such as Aldrich Chemical Co. (Belgium) and Acros (Belgium) unless otherwise specified.

MEK: methyl ethyl ketone

Dowanol PM: propylene glycol methyl ether from DOW Chemical.

PVA-1: partially hydrolyzed poly(vinyl alcohol); degree of saponification is 88 mol %; viscosity of a 4 wt % aqueous solution at 20° C. is 4 mPa·s; available as MOWIOL 4/88 from Kururay.

PVA-2: fully hydrolyzed poly(vinyl alcohol); degree of saponification is 98 mol %; viscosity of an aqueous solution of 4 wt % at 20° C. is 4 mPa·s; available as MOWIOL 4/98 from Kururay.

PVA-3: partially hydrolyzed poly(vinyl alcohol); degree of saponification is 88 mol %; viscosity of an aqueous solution of 8 wt % at 20° C. is 4 mPa·s; available as MOWIOL 8/88 from Kururay.

Acticide LA 1206: a biocide commercially available from THOR.

Lutensol A8: 90 wt % solution of a surface active agent, commercially available from BASF.

FST426R: a solution in MEK containing 88.9 wt % of a reaction product from 1 mole of 2,2,4-trimethyl-hexamethylenediisocyanate and 2 moles of hydroxyethyl-methacrylate (kinematic viscosity 3.30 mm$^2$/s at 25° C.).

HABI: 2-(2-chlorophenyl)-4,5-diphenyl bisimidazole, commercially available from SUMITOMO.

MBT: 2-mercaptobenzthiazole.

Sensitizer 1: a violet sensitizer mixture consisting of the following compounds:

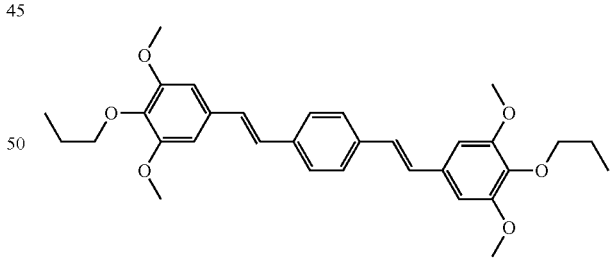

15 wt. %

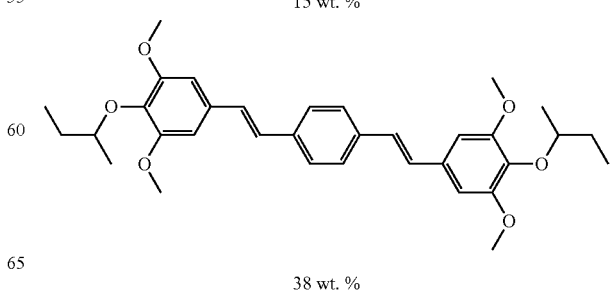

38 wt. %

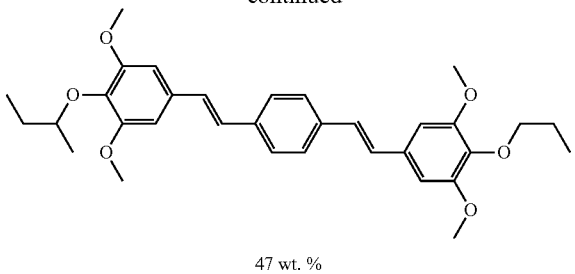

47 wt. %

Metolat FC 355: an ethoxylated ethylene diamine, commercially available from Münzing Chemie.

Edaplan: Edaplan LA 411: 1 wt. % in Dowanol PM of a modified siloxane-glycol copolymer product commercially available from Münzing Chemie GmbH.

Pigment: a 30 wt. % dispersion in Dowanol PM of Hostaperm Blue P-BFS, commercially available from Clariant, stabilized with Disperbyk 182 (50 wt. % solid content), commercially available from BYK Chemie.

Binder: a 10 wt. % solution in Dowanol PM of Gohsefimer L-5407, a 36 mol % hydrolyzed polyvinylalcohol from Nippon Gohsei Co.

Sipomer: Sipomer PAM 100, a methacrylate monomer having a phosphate functionality from Rhodia, diluted to 50 wt. % in Dowanol PM.

Sokalon: Sokalon CP12S, a copolymer of acrylic acid and maleic acid, commercially available as a 50 wt. % solution in water from BASF.

TBMPS: tribromo methyl phenyl sulphone

Sensitizer 2: IR dye having the formula

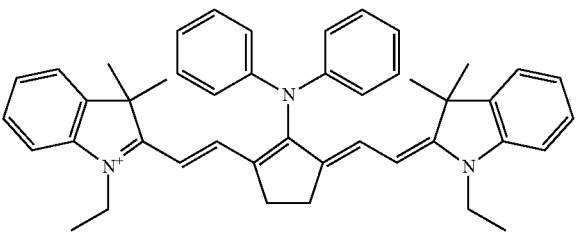

Example 1

Support AS

A 0.3 mm thick aluminum foil was degreased by spraying with an aqueous solution containing 26 g/l NaOH at 65° C. for 2 seconds and rinsed with demineralised water for 1.5 seconds. The foil was then electrochemically grained during 10 seconds using an alternating current in an aqueous solution containing 15 g/l HCl, 15 g/l $SO_4^{2-}$ ions and 5 g/l $Al^{3+}$ ions at a temperature of 37° C. and a current density of about 100 A/dm². Afterwards, the aluminum foil was desmutted by etching with an aqueous solution containing 5.5 g/l NaOH at 36° C. for 2 seconds and rinsed with demineralised water for 2 seconds. The foil was subsequently subjected to anodic oxidation during 15 seconds in an aqueous solution containing 145 g/l of sulfuric acid at a temperature of 50° C. and a current density of 17 A/dm², then washed with demineralised water for 11 seconds and dried at 120° C. for 5 seconds.

The aluminum support thus obtained was characterized by a surface roughness Ra of 0.35-0.4 μm (measured with interferometer NT1100) and had an anodic weight of 3.0 g/m².

Photo Layers PL-01 to PL-03

The compositions of the coating solutions for the photo layers PL-01 to PL-03 are shown in Table 1. The photo layers PL-01 to PL-03 were coated with a bar-coater onto the aluminum substrate AS described above.

TABLE 1

| Ingredients (g) | PL-01 | PL-02 | PL-03 |
|---|---|---|---|
| Edaplan | 0.299 | 0.299 | 0.299 |
| Ethanol | 20.300 | 24.340 | 24.120 |
| Sensitizer 1 | 0.103 | 0.103 | 0.103 |
| FST426R | 0.818 | 0.818 | 1.088 |
| Pigment | 0.798 | 0.798 | 0.798 |
| HABI | 0.156 | 0.156 | 0.156 |
| MBT | 0.042 | 0.042 | 0.042 |
| binder | 10.862 | 6.071 | 6.071 |
| Sipomer | 0.319 | 0.319 | 0.319 |
| Sokalon | 0.479 | 0.479 | 0.479 |

The wet coating thickness was 20 μm. After coating, the layer was dried for 1 minute at 120° C. in a circulation oven. The dry coating weight of each component is given in Table 2.

TABLE 2

| Dry Coating Weight (mg/m²) | PL-01 | PL-02 | PL-03 |
|---|---|---|---|
| Edaplan | 1.50 | 1.50 | 1.50 |
| Sensitizer 1 | 51.60 | 51.60 | 51.60 |
| FST426R | 364.30 | 364.30 | 484.30 |
| Pigment | 120.00 | 120.00 | 120.00 |
| HABI | 78.00 | 78.00 | 78.00 |
| MBT | 21.00 | 21.00 | 21.00 |
| Binder | 544.10 | 304.10 | 304.10 |
| Sipomer | 80.00 | 80.00 | 80.00 |
| Sokalon | 12.00 | 12.00 | 12.00 |
| [monomer]/[binder] | 0.80 | 1.40 | 1.78 |

Overcoat Layer OC

The overcoat layer (top layer) OC was applied from an aqueous solution with a bar-coater on top of the photolayers PL-01 to PL-03. The composition of the OC coating solution is defined in Table 3. The wet coating thickness was 40 μm. After drying at 110° C. for 2 minutes in a circulation oven a dry coverage weight of 1.60 g/m² was obtained.

TABLE 3

| Ingredients | (g) |
|---|---|
| PVA-1 | 17.03 |
| PVA-2 | 14.87 |
| PVA-3 | 7.43 |
| Acticide LA 1206 | 0.26 |
| Metolat FC 355 | 0.38 |
| Lutensol A8 | 0.032 |
| Water | 960 |

Printing Plate Precursors PPP-01 to PPP-03

The following printing plate precursors were obtained (see Table 4):

TABLE 4

| | Aluminum substrate | Photo layer PL | Overcoat layer |
|---|---|---|---|
| PPP-01 | AS | PL-01 | OC |
| PPP-02 | AS | PL-02 | OC |
| PPP-03 | AS | PL-03 | OC |

Exposure, Gum Development and Visual Evaluation

Exposure was carried out on an Agfa Polaris XCV platesetter equipped with a 410 nm violet laser diode of 30 mW. A solid patch was exposed on each printing plate precursor using an energy density of 60 µJ/cm² (at 1270 dpi). After exposure the printing plate precursor was developed in an Agfa CRF 45 table-top processor, equipped with a rotating brush and filled with Agfa RC510 gum. Processing was carried out at room temperature (22° C.) at a speed of 0.62 m/min. The brush pressure was 265.0 g as determined with a spring tensiometer according to the following procedure. A polyester film (50 cm long, 10 cm wide and 0.19 mm thick) was put between the brush roller and the pressure plate. After activation of the brush drive, the polyester strip was kept in place against the rotation of the brush with a spring tensiometer. The brush pressure is read from the spring tensiometer. The total dip time of a given point of the precursor in the gum solution amounted to 27 seconds. The time lapse between the first contact of a given point of the precursor with the gum and the first contact of that point of the precursor with the brush amounted to 14 seconds. The time lapse ($\Delta t$) in seconds between exposing an image-area on the printing plate precursor and the entrance of the image-area in the gum solution, i.e. the actual start of development of the image-area, was carefully assessed.

After development the resulting printing plates were evaluated visually. More specifically, the solids on the plate were evaluated in terms of uniformity and the appearance of brush marks using the following criteria:
1=very strong brush marks are visible
2=strong brush marks are visible
3=moderate brush marks are visible
4=slight brush marks are visible
5=very slight/no brush marks are visible The visual appearance of brush marks indicates that the polymerization process has not been effective in the time scale between exposure and gum development (insufficient curing of the photolayer as to render it resistant enough against the mechanical impact of the brush in the gum development section of the processor). To obtain optimal lithographic properties, the processed printing plates must be characterized by a visual evaluation of 4 or 5. The results of this evaluation are given in Table 5.

TABLE 5

| | PPP | [M]/[B] | $\Delta t$ (s) | Evaluation |
|---|---|---|---|---|
| COMP | PPP-01 | 0.80 | 21 | 1 |
| COMP | PPP-01 | 0.80 | 51 | 1 |
| COMP | PPP-01 | 0.80 | 81 | 1 |
| COMP | PPP-01 | 0.80 | 141 | 3 |
| COMP | PPP-01 | 0.80 | 621 | 4 |
| COMP | PPP-01 | 0.80 | 6500 | 5 |
| COMP | PPP-02 | 1.40 | 21 | 3 |
| COMP | PPP-02 | 1.40 | 51 | 4 |
| INV | PPP-02 | 1.40 | 81 | 5 |
| INV | PPP-02 | 1.40 | 141 | 5 |
| INV | PPP-02 | 1.40 | 621 | 5 |
| INV | PPP-02 | 1.40 | 6500 | 5 |
| COMP | PPP-03 | 1.78 | 21 | 4 |

TABLE 5-continued

| | PPP | [M]/[B] | $\Delta t$ (s) | Evaluation |
|---|---|---|---|---|
| COMP | PPP-03 | 1.78 | 51 | 4 |
| INV | PPP-03 | 1.78 | 81 | 5 |
| INV | PPP-03 | 1.78 | 141 | 5 |
| INV | PPP-03 | 1.78 | 621 | 5 |
| INV | PPP-03 | 1.78 | 6500 | 5 |

It is clear from Table 5 that printing plates obtained with a method according to the present invention, i.e. the ratio of the total amount of monomer to the total amount of binder ([M]/[B]) is at least 1 and the time lapse $\Delta t$ between exposing an image-area on the printing plate precursor and contacting the image-area with the gum solution is at least 1 minute (or 60 seconds), have sufficient physical strength. When [M]/[B] becomes higher, a further improvement of the physical strength, especially at lower $\Delta t$, is observed. When [M]/[B] is lower than 1, sufficient physical strength is only observed when the time lapse is substantially higher than 1.

Example 2

Photo Layers PL-04 and PL-05

The composition of the coating solutions for the photo layers PL-04 and PL-05 is shown in Table 6. The photo layers PL-04 and PL-05 were coated with a bar-coater onto the aluminum substrate AS described above.

TABLE 6

| Ingredients (g) | PL-04 | PL-05 |
|---|---|---|
| Edaplan | 0.299 | 0.299 |
| Ethanol | 21.420 | 24.470 |
| Sensitizer 2 | 0.072 | 0.072 |
| FST426R | 0.810 | 0.810 |
| Pigment | 0.798 | 0.798 |
| TBMPS | 0.177 | 0.120 |
| Binder | 9.664 | 6.071 |
| Sipomer | 0.319 | 0.319 |
| Sokalon | 0.479 | 0.479 |

The wet coating thickness was 20 µm. After coating, the layer was dried for 1 minute at 120° C. in a circulation oven. The dry coating weight of each component is given in Table 7.

TABLE 7

| Dry Coating Weight (mg/m²) | PL-04 | PL-05 |
|---|---|---|
| Edaplan | 1.5 | 1.5 |
| Sensitizer 2 | 36.0 | 36.0 |
| FST426R | 364.3 | 364.3 |
| Pigment | 120.0 | 120.0 |
| TBMPS | 88.6 | 60.4 |
| Binder | 484.1 | 304.1 |
| Sipomer | 80.0 | 80.0 |
| Sokalon | 12.0 | 12.0 |
| [monomer]/[binder] | 0.90 | 1.40 |

Printing Plate Precursors PPP-04 to PPP-05

On top of the photo layer, the above described overcoat layer OC was applied with bar-coater. The following printing plate precursors were obtained (see Table 8):

TABLE 8

|  | Aluminum substrate | Photo layer PL | Overcoat layer OC |
|---|---|---|---|
| PPP-04 | AS | PL-04 | OC |
| PPP-05 | AS | PL-05 | OC |

Exposure, Gum Development and Visual Evaluation

Exposure was carried out on a Creo TrendSetter 3244 platesetter, which is equipped with 830 nm IR laser diodes (theoretical total power 40 W). A solid patch was exposed on each printing plate precursor using an energy density of 150 mJ/cm$^2$ (at 2400 dpi).

Gum development and the visual evaluation off the developed printing plates was performed as in Example 1. The results of the visual evaluation are given in Table 9.

TABLE 9

|  | PPP | [M]/[B] | Δt (s) | Evaluation |
|---|---|---|---|---|
| COMP | PPP-04 | 0.90 | 38 | 1 |
| COMP | PPP-04 | 0.90 | 60 | 2 |
| COMP | PPP-04 | 0.90 | 120 | 3 |
| COMP | PPP-04 | 0.90 | 300 | 3 |
| COMP | PPP-04 | 0.90 | 600 | 4 |
| COMP | PPP-04 | 0.90 | >3600 | 5 |
| COMP | PPP-05 | 1.40 | 38 | 3 |
| INV | PPP-05 | 1.40 | 60 | 4 |
| INV | PPP-05 | 1.40 | 120 | 5 |
| INV | PPP-05 | 1.40 | 300 | 5 |
| INV | PPP-05 | 1.40 | 600 | 5 |
| INV | PPP-05 | 1.40 | >3600 | 5 |

It is clear from Table 9 that printing plates obtained with a method according to the present invention, i.e. the ratio of the total amount of monomer to the total amount of binder ([M]/[B]) is at least 1 and the time lapse Δt between exposing an image-area on the printing plate precursor and contacting the image-area with the gum solution is at least 1 minute (or 60 seconds), have sufficient physical strength. When [M]/[B] is lower than 1, sufficient physical strength is only observed when the time lapse is substantially higher than 1.

The invention claimed is:

1. A method of preparing a lithographic printing plate in which no pre-heat step is utilized comprising the steps of:
    providing a lithographic printing plate precursor comprising a support and a photopolymerizable image-recording layer, the image-recording layer comprising a monomer and a binder;
    image-wise exposing the precursor in an exposure unit; and
    off press developing the exposed precursor with an aqueous solution in a processing unit, wherein the ratio of the total amount of monomer to the total amount of binder is at least 1 and the time lapse between exposing an image-area of the precursor and contacting the image-area with the aqueous solution is at least 2.5 minutes.

2. The method according to claim 1, wherein the time lapse is at least 5 minutes.

3. The method according to claim 1, wherein the exposed precursor is automatically transported from the exposure unit towards the processing unit by transferring means.

4. The method according to claim 2, wherein the exposed precursor is automatically transported from the exposure unit towards the processing unit by transferring means.

5. The method according to claim 3, wherein the transferring means comprise a stacking unit for temporary storage of the exposed precursor.

6. The method according to claim 4, wherein the transferring means comprise a stacking unit for temporary storage of the exposed precursor.

7. The method according to claim 1, wherein the ratio of the total amount of monomer to the total amount of binder is at least 1.5.

8. The method according to claim 2, wherein the ratio of the total amount of monomer to the total amount of binder is at least 1.5.

9. The method according to claim 1, wherein the aqueous solution has a pH between 2 and 10.

10. The method according to claim 1, wherein the image-recording layer comprises an adhesion promoter containing an ethylenically-unsaturated group and a group capable of interacting with the support.

11. The method according to claim 2, wherein the image-recording layer comprises an adhesion promoter containing an ethylenically-unsaturated group and a group capable of interacting with the support.

12. The method according to claim 8, wherein the image-recording layer comprises an adhesion promoter containing an ethylenically-unsaturated group and a group capable of interacting with the support.

13. The method according to claim 1, wherein the binder has an acid value of less than 0.3 meq/g.

14. The method according to claim 13, wherein the binder is a partially hydrolyzed polyvinylalcohol with a hydrolysis degree of between 10 and 65 mol %.

15. The method according to claim 1, wherein the image-recording layer comprises a hydrophilic polymer having at least 1 mol % of a first monomeric unit having a phosphate group, a phosphonate group, a carboxylic acid group, a sulphonic acid group, a phenolic group, a trialkoxysilane group, an ammonium group or a phosphonium group and at least 30 mol % of a second monomeric unit having a hydrophilic group.

16. The method according to claim 8, wherein the image-recording layer comprises a hydrophilic polymer having at least 1 mol % of a first monomeric unit having a phosphate group, a phosphonate group, a carboxylic acid group, a sulphonic acid group, a phenolic group, a trialkoxysilane group, an ammonium group or a phosphonium group and at least 30 mol % of a second monomeric unit having a hydrophilic group.

17. The method according to claim 1, wherein the image-recording layer comprises a pigment which does not contain a dispersant or which is dispersed with a dispersant which is free from a —COOH, —PO$_3$H$_2$ and a —OPO$_3$H$_2$ group.

18. The method according to claim 8, wherein the image-recording layer comprises a pigment which does not contain a dispersant or which is dispersed with a dispersant which is free from a —COOH, —PO$_3$H$_2$ and a —OPO$_3$H$_2$ group.

19. The method according to claim 16, wherein the image-recording layer comprises a pigment which does not contain a dispersant or which is dispersed with a dispersant which is free from a —COOH, —PO$_3$H$_2$ and a —OPO$_3$H$_2$ group.

20. The method according to claim 18, wherein the image-recording layer comprises a pigment which does not contain a dispersant or which is dispersed with a dispersant which is free from a —COOH, —PO$_3$H$_2$ and a —OPO$_3$H$_2$ group.

21. The method according to claim 1, wherein the image-recording layer comprises a binder with a glass transition temperature Tg of less than 80° C.

* * * * *